(12) United States Patent
Jung

(10) Patent No.: US 6,940,743 B2
(45) Date of Patent: Sep. 6, 2005

(54) SEMICONDUCTOR MEMORY DEVICES FOR OUTPUTTING BIT CELL DATA WITHOUT SEPARATE REFERENCE VOLTAGE GENERATOR AND RELATED METHODS OF OUTPUTTING BIT CELL DATA

(75) Inventor: Jong-hoon Jung, Kyungki-do (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 10/864,276

(22) Filed: Jun. 9, 2004

(65) Prior Publication Data

US 2005/0018470 A1 Jan. 27, 2005

(30) Foreign Application Priority Data

Jun. 11, 2003 (KR) ................................. 10-2003-0037459

(51) Int. Cl.[7] .......................... G11C 11/00; G11C 11/24; G11C 7/02
(52) U.S. Cl. .......................... 365/145; 149/365; 149/210
(58) Field of Search ................................. 365/145, 149, 365/207, 210

(56) References Cited

U.S. PATENT DOCUMENTS

| 5,737,260 | A | * | 4/1998 | Takata et al. | ................ | 365/145 |
| 5,991,188 | A | * | 11/1999 | Chung et al. | ................ | 365/145 |
| 6,198,651 | B1 | * | 3/2001 | Lee et al. | .................... | 365/145 |
| 6,236,588 | B1 | * | 5/2001 | Koo | ........................... | 365/145 |
| 6,577,548 | B1 | * | 6/2003 | Barth et al. | ................. | 365/149 |
| 6,738,282 | B2 | * | 5/2004 | Jo | ............................... | 365/149 |

* cited by examiner

Primary Examiner—Trong Phan
(74) Attorney, Agent, or Firm—Myers Bigel Sibley & Sajovec

(57) ABSTRACT

Semiconductor memory devices are provided which include an array of memory cells, an array of reference cells, and a plurality of sense amplifiers that are associated with respective of the memory cells. The reference cells have a first capacitor that is coupled to a first supply voltage, to a first complementary bit line associated with one of the memory cells and to a second complementary bit line that is associated with a different memory cell. The sense amplifiers are configured to sense and amplify the voltage difference between a signal on the first bit line and a signal on the first complementary bit line. These semiconductor memory devices may output bit cell data without a separate reference voltage generator.

24 Claims, 5 Drawing Sheets

SEMICONDUCTOR MEMORY DEVICES FOR OUTPUTTING BIT CELL DATA WITHOUT SEPARATE REFERENCE VOLTAGE GENERATOR AND RELATED METHODS OF OUTPUTTING BIT CELL DATA

CROSS REFERENCE TO RELATED APPLICATION

This application claims priority under 35 U.S.C. § 119 from Korean Patent Application No. 2003-37459, filed on Jun. 11, 2003 in the Korean Intellectual Property Office, the disclosure of which is hereby incorporated by reference in its entirety.

FIELD OF THE INVENTION

The present invention relates to semiconductor memory devices and, more particularly, to dynamic random access memory (DRAM) devices.

BACKGROUND OF THE INVENTION

Dynamic random access memory (DRAM) devices are a well known type of semiconductor memory device. Typically, a DRAM device includes a memory cell block array that includes a plurality of memory cells or "bit cells." Each of these bit cells can be used to store a single bit of data.

As is well known to those of skill in the art, DRAM devices typically perform a pre-charging operation in which a bit line and a complementary bit line are pre-charged to a predetermined voltage. The bit line delivers a voltage to a capacitor that is part of each bit cell, and the complementary bit line carries a signal that has a logic state which is the inverse of the bit line. During the pre-charge operation, both the bit line and the complementary bit line are pre-charged to a predetermined voltage before a bit cell data read operation or "active" operation is performed.

During a bit cell read operation, charge stored in the capacitor of the bit cell is shared with the bit line, thus producing a small voltage change in the bit line, while the complementary bit line maintains the precharge voltage or has a reference voltage supplied to it by a separate reference circuit. A sense amplifier may then sense the voltage difference between the bit line and the complementary bit line. The sense amplifier amplifies this voltage differential to a larger voltage differential such as, for example, the voltage difference between the supply voltage (VDD) and a ground voltage (VSS) or other reference voltage, and outputs the amplified voltage differential.

The precharge voltage may, for example, be the supply voltage VDD, a half supply voltage VDD/2, or the ground or other reference voltage VSS. When either the supply voltage VDD or the reference voltage VSS is used as the precharge voltage, problems may arise during bit cell data read operations because, depending upon the data stored in the bit cell, the bit line and the complementary bit line may be charged to the same voltage. For instance, when the ground voltage VSS is used as the precharge voltage, if the data in the bit cell is in a first logic state, i.e., "0", both the bit line and the complementary bit line may maintain the ground voltage VSS, resulting in a failure to change the voltage of the bit line. Likewise, when the supply voltage VDD is used as the precharge voltage, if the data in the bit cell is in a second logic state, i.e., "1", both the bit line and the complementary bit line may maintain the supply voltage VDD, resulting in a failure to change the voltage of the bit line.

Using the half supply voltage VDD/2 may resolve the aforementioned problems with bit cell data read operations that may occur if the supply voltage VDD or the reference voltage VSS is used as the precharge voltage. In particular, if the half supply voltage VDD/2 is used as the precharge voltage, during bit cell data read operations a predetermined difference between the voltage applied to the bit line and the voltage applied to the complementary bit line will exist when the bit cell data is in either the first or second logic states. However, using the half supply voltage VDD/2 as the precharge voltage may create its own problems, because it requires a mechanism for generating the half supply voltage VDD/2 that is used to precharge the bit lines. Typically, a high-capacity half VDD generator is used to generate the half supply voltage VDD/2, but such a voltage generator may occupy a large area on the chip and increase power consumption due to the need for a large standby current.

During the bit line data read operation, the complementary bit line may have the reference voltage provided by a separate reference circuit. FIG. 1 is a schematic diagram of the peripheral circuit for a reference word line of a conventional semiconductor memory device that provides a reference voltage using a separate reference voltage generator. As shown in FIG. 1, a reference voltage control signal RPRE is activated (i.e., set to logic "1") prior to the bit cell data read operation, thereby activating a transistor M2 and charging the reference capacitor CL to the half supply voltage VDD/2. During the bit cell data read operation, the reference word line signal RWL is activated in order to activate a transistor M1, thus causing a predetermined difference between a voltage applied to a complementary bit line BLB and a voltage applied to the bit line (which is not depicted in FIG. 1). However, in the technique depicted in FIG. 1, a half supply voltage VDD generator is needed to precharge the reference capacitor CL to the half supply voltage VDD/2. As noted above, the half supply voltage VDD generator may occupy a large area on a chip and causes power consumption due to a large standby current.

FIG. 2 is a schematic diagram of the peripheral circuit for a reference word line of a conventional semiconductor memory device that provides a reference voltage using a half reference capacitor. Referring to FIG. 2, the reference voltage control signal RPRE is activated prior to the bit cell data read operation, thereby activating a transistor M2 so as to precharge a reference capacitor CL/2 to the reference voltage VSS. Typically, the capacitance of the reference capacitor CL/2 is set to be approximately half the capacitance of the capacitor that Stores the bit cell data (not depicted in FIG. 2). During the bit cell data read operation, the reference word line signal RWL is activated in order to activate a transistor M1, thus causing a predetermined difference between the voltage applied to the complementary bit line BLB and the voltage applied to the bit line (which is not depicted in FIG. 2). However, the precharge technique depicted in FIG. 2 typically requires modification of the cell array manufacturing process.

SUMMARY OF THE INVENTION

Pursuant to embodiments of the present invention, semiconductor memory devices are provided which include a memory cell array, a reference cell array, and a sense amplifier unit. The memory cell array has at least first and second memory cells and at least one word line, where the first memory cell has an associated first bit line and an associated first complementary bit line and the second memory cell has an associated second bit line and an associated second complementary bit line. The reference cell array includes at least one reference cell that has a first capacitor that is coupled to a first supply voltage, to the first complementary bit line and to the second complementary bit line. The sense amplifier unit comprises at least one sense amplifier that is associated with the first memory cell. This sense amplifier may be configured to sense and amplify the voltage difference between a signal on the first bit line and a signal on the first complementary bit line.

In embodiments of the present invention, the reference cell may supply a reference cell voltage to both the first and second memory cells. The reference cell may also include a first transistor that is coupled between the first capacitor and the first complementary bit line and a second transistor that is coupled between the first capacitor and the second complementary bit line. A reference cell voltage signal may be output from the first capacitor in response to the activation of a reference word line signal that turns on the first and second transistors. The pulse width of this activated reference word line signal may be smaller than the pulse width of the activated word line signal. The reference cell may also include a third transistor that is coupled between the first supply voltage and the first capacitor. The third transistor may be turned on in response to activation of a ready signal to charge the first capacitor to the first supply voltage.

In further embodiments of the present invention, the reference cell may include a second capacitor that is coupled to a second supply voltage, to the first capacitor and to the second complementary bit line. In these embodiments, the reference cell may also include a first transistor that is coupled between the first capacitor and the second capacitor. The reference cell voltage may be stored in the first and second capacitors in response to a signal that turns on the first transistor to cause charge-sharing between the first and second capacitors. The device may also include a second transistor that is coupled between the first capacitor and the first supply voltage, a third transistor that is coupled between the second capacitor and the second supply voltage, a fourth transistor that is coupled between the first complementary bit line and the first capacitor and/or a fifth transistor that is coupled between the second capacitor and the second complementary bit line.

Pursuant to further embodiments of the present invention, method of reading a data bit from a memory cell in a memory cell array are provided. Pursuant to these methods, a bit line and a complementary bit line that are associated with a memory cell in the array are precharged to a first supply voltage. A second supply voltage is stored in a reference cell that is associated with the memory cell. A reference signal is output from the reference cell to the complementary bit line, where the reference signal has a voltage that is between the first supply voltage and a second supply voltage, such as, for example a voltage equal to approximately one-half the second supply voltage. A voltage difference between the bit line and the complementary bit line may then be sensed and amplified to output the data bit from the memory cell.

In embodiments of the invention, the reference signal may be output from the reference cell to the complementary bit line by coupling the stored second supply voltage to the complementary bit line and to a complementary bit line that is associated with a second memory cell in response to activation of a reference word line signal. The pulse width of the activated reference word line signal may be less than the pulse width of an activated word line signal that is carried by a word line associated with the memory cell. The second supply voltage may be stored in a first capacitor in the reference cell, and the first supply voltage may be stored in a second capacitor in the reference cell. The reference cell voltage may be stored in at least one of the first and second capacitors by sharing charge between the first and second capacitors.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION

Figure 1:
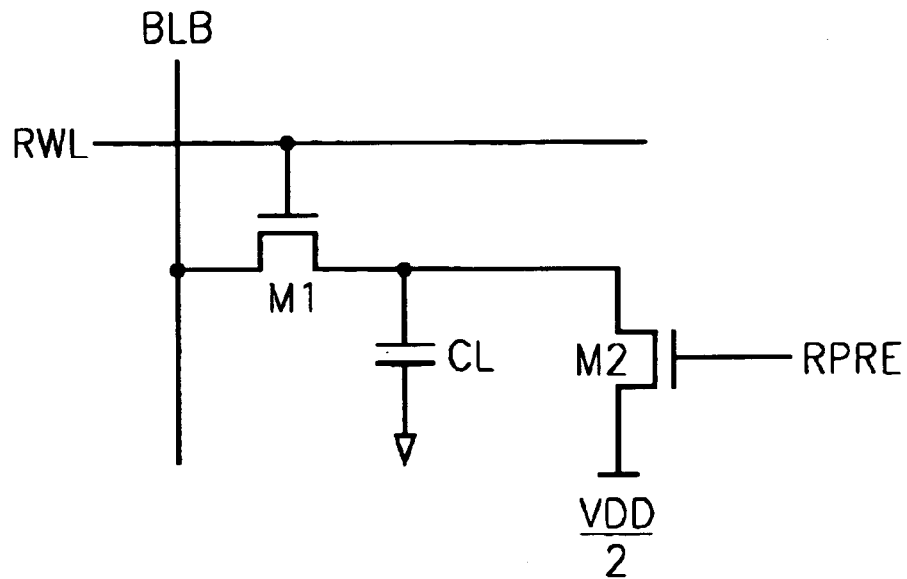
FIG. 1 is a schematic diagram of the peripheral circuit for a reference word line of a conventional semiconductor memory device that provides a reference voltage using a separate reference voltage generator.

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like reference numerals refer to like elements throughout.

Figure 3:
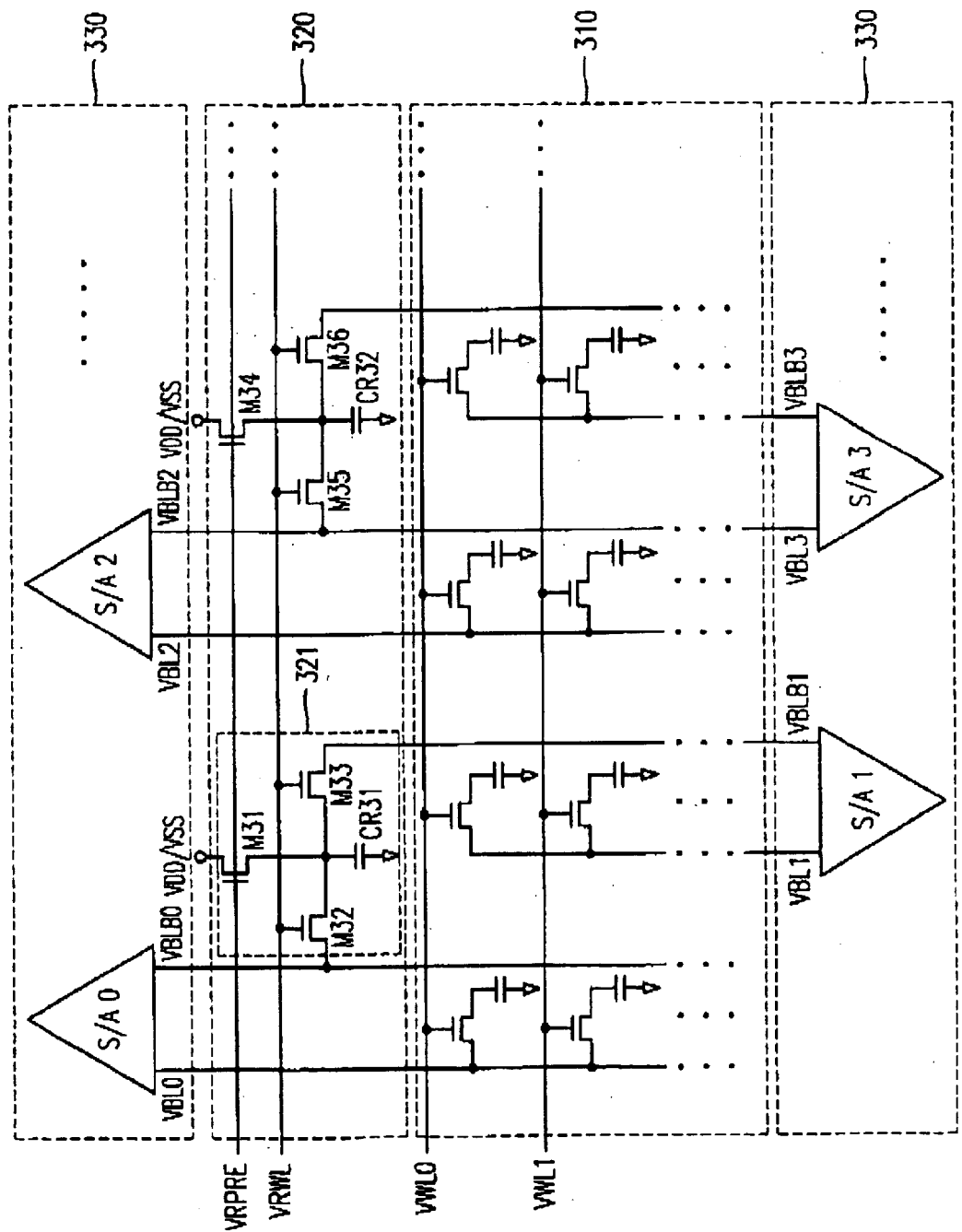
FIG. 3 is a block diagram of a semiconductor memory device according to first embodiments of the present invention.

FIG. 3 is a block diagram of a semiconductor memory device according to embodiments of the present invention. The semiconductor memory device depicted in FIG. 3 may output bit cell data by sensing and amplifying a bit cell signal read from one of the bit cells and a reference signal read from a reference cell in a bit cell data read operation. The semiconductor memory device includes a bit cell array unit 310, a reference cell array unit 320, and a sense amplifying unit 330 that includes sense amplifiers S/A 0, S/A 1, S/A 2, S/A 3, etc.

The bit cell array unit 310 comprises a plurality of bit cells, each of which may be used to store bit cell data ("0" or "1"). As shown in FIG. 3, each bit cell may be implemented, for example, as a metal-oxide-semiconductor field effect transistor (MOSFET) and a capacitor. The individual bit cells may be defined by the intersections of a plurality of bit lines (VBL0 signal line, VBL1 signal line, VBL2 signal line, VBL3 signal line. etc., a plurality of complementary bit lines (VBLB0 signal line, VBLB1 signal line, VBLB2 signal line, VBLB3 signal line, etc.) and a plurality of word lines (VWL0 signal line, VWL1 signal line, etc.). The bit cell array unit 310 outputs a bit cell signal (e.g., VBL0) that is read from a bit cell to a selected first bit line (e.g., the VBL0 signal line). The bit cell may be defined by an activated word line signal (e.g., VWL0), a selected bit line (e.g., the VBL0 signal line) and a selected complementary bit line (e.g., the VBLB0 signal line). When the bit cell data is in a first logic state, i.e., "0", a first supply voltage (e.g., VSS) is stored in the capacitor of the bit cell. When the bit cell data is in a second logic state, i.e., "1", a second supply voltage (e.g., VDD) is stored in the capacitor of the bit cell.

In the semiconductor memory device of FIG. 3, an X-decoder inputs, via one of the word lines, the activated word line signal (e.g., VWL0) to the gate of the MOSFET of the bit cell. This operation enables bit cell data to be read from the bit cell. The Y-decoder selects the bit line and the complementary bit line corresponding to the bit cell selected by the X-decoder to read the data from the bit cell.

Figure 2:
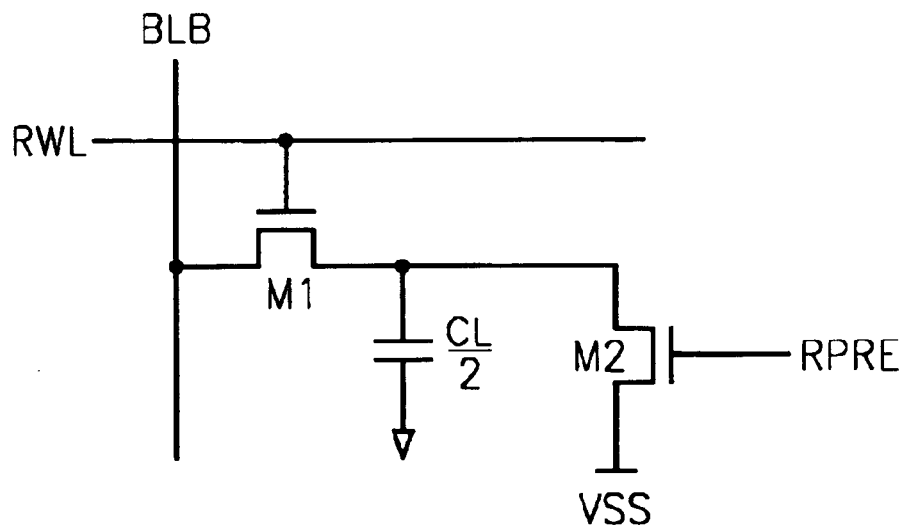
FIG. 2 is a schematic diagram of the peripheral circuit for a reference word line of a conventional semiconductor memory device that provides a reference voltage using a separate half reference capacitor.

The reference cell array unit 320 includes a plurality of reference cells, such as reference cell 321. Reference cell 321 comprises MOSFETs M31–M33 and capacitor CR31. A second reference cell is also depicted in FIG. 3 that includes MOSFETS M34–M36 and capacitor CR32. A reference cell voltage (e.g., VDD or VSS) is stored in each of the reference cells in the reference cell array unit 320 in response to activation of a ready signal VRPRE. The reference cell array unit 320 outputs a reference signal which is read from the reference cell (e.g., reference cell 321) that is associated with the selected complementary bit line (e.g., the VBLB0 signal line) in response to an activated reference word line signal VRWL. The reference signal read from the corresponding reference cell (e.g., reference cell 321) is output to both the selected complementary bit line (e.g., the VBLB0 signal line) and an adjacent complementary bit line (e.g., the VBLB1 signal line) at the same time, so as to produce a predetermined voltage difference between a voltage applied to the selected complementary bit line (e.g., the VBLB0 signal line) and a voltage applied to the selected bit line (e.g., the VBL0 signal line), as discussed above with reference to FIGS. 1 and 2. When the selected complementary bit line is the VBLB1 signal line, the adjacent complementary bit line is the VBLB0 signal line.

Each of the reference cells in the reference cell array unit 320 may perform the above-described operation. In each reference cell, the MOSFET that connects to the reference cell voltage (e.g., M31, M34) can be an n-type MOSFET or a p-type MOSFET. For example, when the selected bit line and complementary bit line are the VBL0 and VBLB0 signal lines, the reference cell voltage (VDD/VSS) is applied to the capacitor CR31 of reference cell 321 via the NMOSFET M31 in response to activation of the ready signal VRPRE. The reference cell 321 outputs the reference signal, which is read from the capacitor CR31, via the MOSFET M32 or M33 in response to activation of a reference word line signal VRWL. As shown in FIG. 3, the reference signal is output to the selected complementary bit line (e.g., the VBLB0 signal line) and an adjacent complementary bit line (e.g., the VBLB1 signal line). If the reference cell voltage is set as the first supply voltage VSS, the MOSFET M31 may be implemented as an n-type MOSFET that is turned on in response to activation of the reference word line signal VRWL. If the reference cell voltage is set as the second supply voltage VDD, the MOSFET M31 may instead be implemented as a p-type MOSFET.

Figure 4:
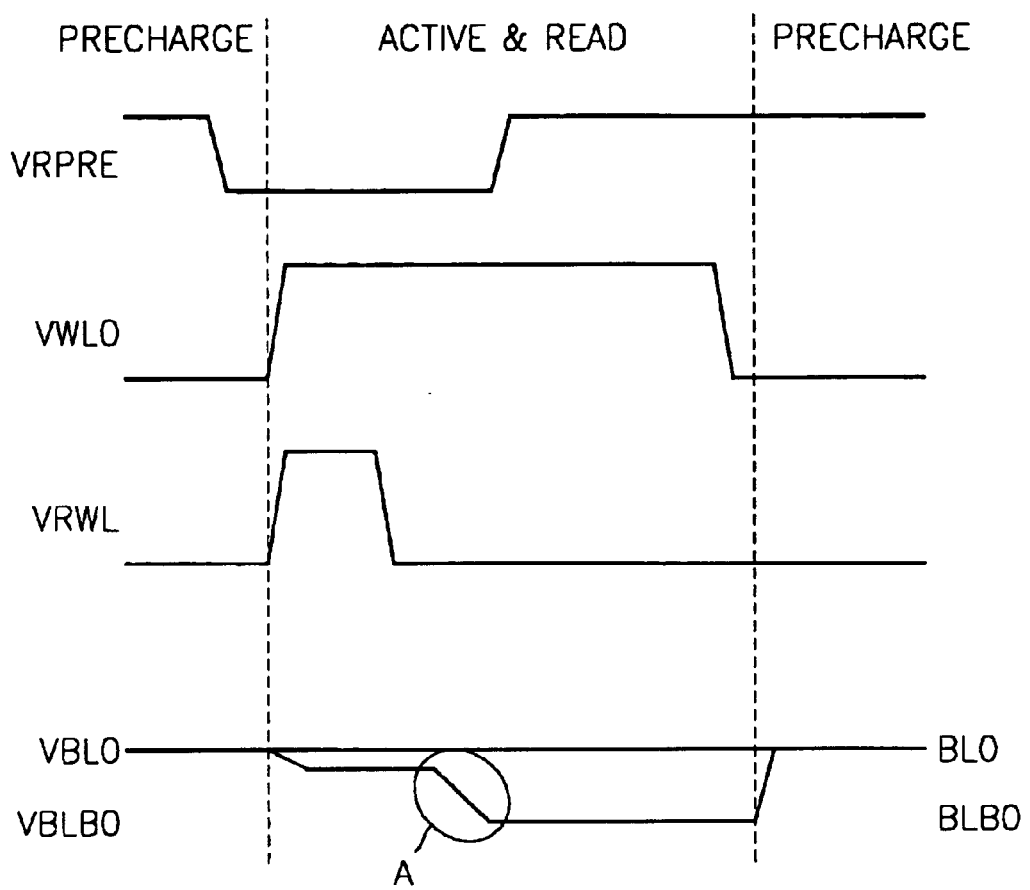
FIG. 4 is a timing diagram illustrating the operation of the semiconductor memory device of FIG. 3.

FIG. 4 is a timing diagram illustrating operations of the semiconductor memory device of FIG. 3. Typically, a semiconductor memory device precharges the bit lines and the complementary bit lines in response to a predetermined control signal that is activated prior to the bit cell data read operation. As shown in FIG. 4, while the bit lines and the complementary bit lines are precharging, the ready signal VRPRE is activated. The ready signal VRPRE is activated after the reference word line signal VRWL is deactivated. As is also shown in FIG. 4, the pulse width of the reference word line signal VRWL is smaller than that of the word line signal VWL0. This pulse width is only amplified by the sense amplifier S/A 0 when the selected bit line and the selected complementary bit line are the VBL0 signal line and the VBLB0, respectively, thereby removing unnecessary power consumption due to amplification by an adjacent sense amplifier S/A 1. In FIG. 3, when the bit lines and the complementary bit lines are precharged to the first supply voltage VSS prior to the bit cell data read operation, the reference cell voltage is the second supply voltage VDD. When the bit lines and the complementary bit lines are precharged to the second supply voltage VDD, the reference cell voltage is the first supply voltage VSS.

Thus, during the bit cell data read operation, a voltage difference between the selected bit line and the selected complementary bit line is stably produced when the bit cell data is in either the first or second logic state. The capacitance of the capacitor of each of the bit cells is equal to the capacitance of the capacitor of each of the reference cells. When the selected bit line and the selected complementary bit line are the VBL0 signal line and the VBLB0 signal line, respectively, the capacitor of the bit cell shares charge with the selected VBL0 signal line, and the capacitor CR31 of the reference cell shares charge with both the selected complementary bit line and an adjacent complementary bit line. As a result, a voltage difference sufficient to be sensed by the sense amplifying unit 330 is produced between the selected bit line and the selected complementary bit line.

The sense amplifying unit 330 includes a plurality of sense amplifiers S/A 0, S/A 1, etc. One of the sense amplifiers (e.g., sense amplifier S/A 0) of the sense amplifying unit 330 receives the bit cell signal that is output to the selected bit line (e.g., the VBL0 signal line) and the reference signal that is output to the selected complementary bit line (e.g., the VBLB0 signal line). The sense amplifier (e.g., S/A 0) amplifies the voltage difference between the received bit cell signal and the reference signal and outputs the amplified voltage difference. An output signal waveform of the sense amplifier S/A 0 is depicted in section A of FIG. 4.

Figure 5:
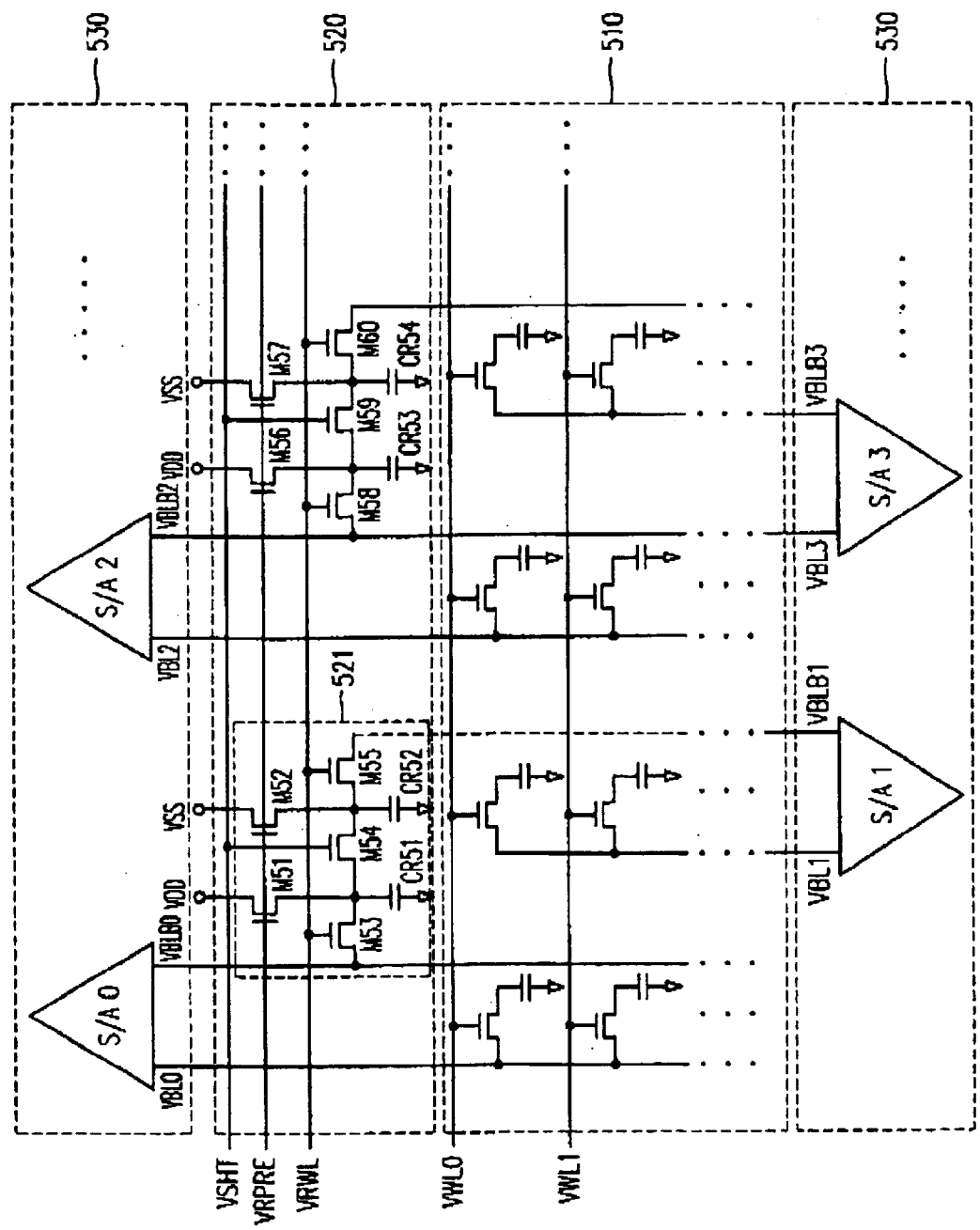
FIG. 5 is a block diagram of a semiconductor memory device according to second embodiments of the present invention.

FIG. 5 is a block diagram of a semiconductor memory device according to further embodiments of the present invention. As shown in FIG. 5, the semiconductor memory devices according to these further embodiments of the present invention output bit cell data by sensing and amplifying a bit cell signal read from a bit cell and a reference signal read from a reference cell during a bit cell data read operation. The semiconductor memory devices may include a bit cell array unit 510, a reference cell array unit 520, and a sense amplifying unit 530 that includes sense amplifiers S/A 0, S/A 1, S/A 2, S/A 3, etc.

The bit cell array unit 510 stores bit cell data (i.e., a "0" or "1") in each of the bit cells. The individual bit cells may be embodied as a MOSFET and a capacitor. The bit cells are defined by the intersections of a plurality of bit lines (VBL0 signal line, VBL1 signal line, VBL2 signal line, VBL3 signal line, etc.), a plurality of complementary bit lines (VBLB0 signal line, VBLB1 signal line, VBLB2 signal line, VBLB3 signal line, etc.) and a plurality of word lines (VBL0 signal line, VBL1 signal line, etc.). The bit cell array unit 310 outputs a bit cell signal (e.g., VBL0), read from a bit cell, to a selected bit line (e.g., the VBL0 signal line). Here, the bit cell is defined by an activated word line signal (e.g., VBL0), a selected bit line (e.g., the VBL0 signal line) and a selected complementary bit line (e.g., the VBLB0 signal line). When the bit cell data is in the first logic state, a first supply voltage VSS is stored in a capacitor of a bit cell. When the bit cell data is in the second logic state, a second supply voltage VDD is stored in the capacitor of the bit cell.

In the semiconductor memory device of FIG. 5, an X-decoder inputs, via one of the word lines, the activated word line signal (e.g., VWL0) to the gate of the MOSFET of the bit cell. This operation enables bit cell data to be read from the bit cell. The Y-decoder selects the bit line and the complementary bit line corresponding to the bit cell selected by the X-decoder to read the data from the bit cell.

The reference cell array unit 520 includes a plurality of reference cells, such as reference cell 521. The reference cell 521 comprises MOSFETs M51–M55 and capacitors CR51–CR52. A second reference cell is also depicted in FIG. 5 that includes MOSFETS M64–M60 and capacitors CR53–CR54. The reference cell 521 provides the first supply voltage VSS and the second supply voltage VDD to capacitors CR51 and CR52, respectively, in response to activation of the ready signal VRPRE. The reference cell 521 stores a reference cell voltage, which results from charge sharing between the capacitors CR51 and CR52, in response to activation of a short signal VSHT. The reference cell 521 then outputs reference signals read from the capacitors CR51 and CR52 to the complementary bit line (the VBLB0 signal line) and an adjacent complementary bit line (the VBLB1 signal line). In the embodiments of the present invention illustrated in FIG. 5, charge is shared between the two capacitors of the reference cell (e.g., capacitors CR51 and CR52 ) for purposes of producing a predetermined voltage difference between a voltage applied to the selected complementary bit line (e.g., the VBLB0 signal line) and a voltage applied to the selected bit line (e.g., the VBL0 signal line). The reference signals read from the reference cells are output to both the selected complementary bit line (e.g., the VBLB0 signal line) and the adjacent complementary bit line (e.g., the VBLB1 signal line) at the same time, so as to enable two complementary bit lines, i.e., the VBLB0 signal line and the VBLB1 signal line, to share one reference cell. Thus, when the selected complementary bit line is the VBLB1 signal line, the adjacent complementary bit line is the VBLB0 signal line.

Each of the reference cells of the reference cell array unit 520 may perform the operation that is described above with respect to reference cell 521. The MOSFETs in each reference cell in the positions of MOSFETS M53 and M55 can be either n-type of p-type MOSFETs. For example, when the selected bit line is the VBL0 signal line and the selected complementary bit line is the VBLB0 signal line and the ready signal VRPRE is activated, the reference cell array unit 520 provides the first supply voltage VSS to the capacitor CR51 via the MOSFET M51 and provides the second supply voltage VDD to the capacitor CR52 via the MOSFET M52. A short signal VSHT may then be activated, thereby turning on MOSFET M54 so that charge sharing is induced between the capacitors CR51. and CR52 and the reference cell array unit 520 thereby stores a reference cell voltage which is between the first supply voltage VSS and the second supply voltage VDD (typically about VDD/2). Then, in response to activation of the reference word line signal VRWL, the reference cell array unit 520 outputs the reference signals from the capacitors CR51 and CR52, via the NMOSFETs M53 and M55, to the selected complementary bit line (e.g., the VBLB0 signal line) and an adjacent complementary bit line (e.g., the VBLB1 signal line).

Figure 6:
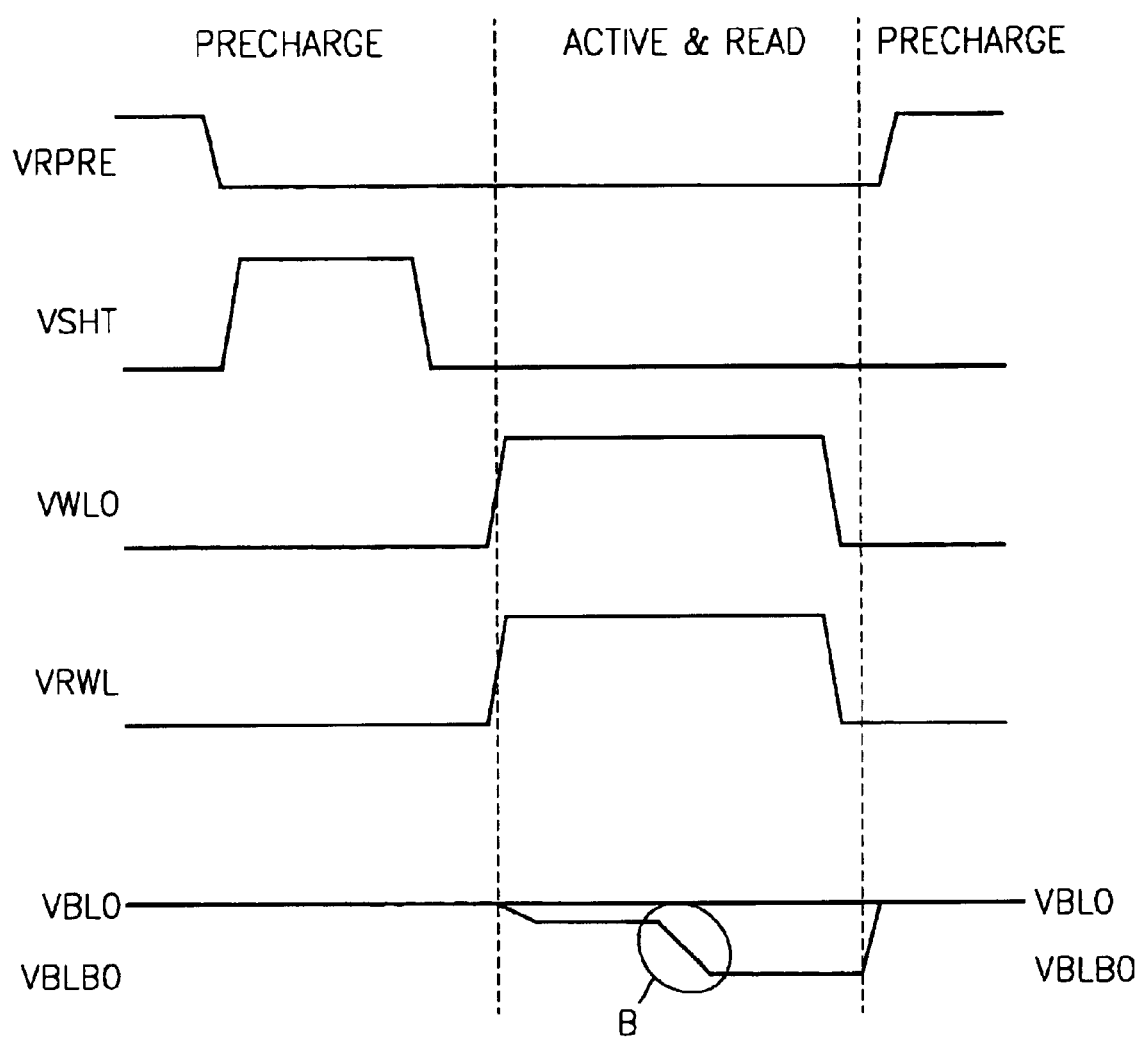
FIG. 6 is a timing diagram illustrating the operation of the semiconductor memory device of FIG. 5.

FIG. 6 is a timing diagram illustrating operations of the semiconductor memory device of FIG. 5. The bit lines and the complementary bit lines may be precharged in response to a predetermined control signal that is activated prior to the bit cell data read operation. While the bit lines and the complementary bit lines are precharging, the ready signal VRPRE is activated. As shown in FIG. 6, the pulse width of the activated reference word line signal VRWL is equal to the pulse width of the activated word line signal VWL0. As is apparent from FIG. 5, when the selected bit line is the VBL0 signal line and the selected complementary bit line is the VBLB0 signal line, the selected complementary bit line does not share a charge with the adjacent complementary bit line. Thus, in contrast to the semiconductor memory device in FIG. 3, in the embodiment of the present invention depicted in FIG. 5 the pulse widths of the activated reference word line signal VRWL and the activated word line signal VWL0 may be identical.

As should be clear from the above, the embodiments of the present invention depicted in FIG. 5 can stably produce a voltage difference between the selected bit line and the selected complementary bit line during a bit cell data read operation when the bit cell data is in either the first or second logic state. The capacitance of the capacitor of the bit cell is equal to that of the capacitor of a reference cell. When the selected bit line and the selected complementary bit line are the VBL0 signal line and the VBLB0 signal line, respectively, the capacitor of the bit cell shares charge with the selected bit line and the capacitor CR51 of the reference cell shares a charge with the selected complementary bit line. As a result, a voltage difference sufficient to be sensed by the sense amplifying unit 530 is produced between the selected bit line and the selected complementary bit line. Such a voltage difference can be produced because the capacitors CR51 and CR52 share charge via the NMOSFET M54 in response to activation of the short signal VSHT. The reference cell voltage is thus between the first supply voltage VSS and the second supply voltage VDD, and typically is about VDD/2.

The sense amplifying unit 530 includes a plurality of sense amplifiers S/A 0, S/A 1, etc. One of the sense amplifiers (e.g., sense amplifier S/A 0) of the sense amplifying unit 530 receives the bit cell signal that is output to the selected bit line (e.g., the VBL0 signal line) and the reference signal that is output to the selected complementary bit line (e.g., the VBLB0 signal line). The sense amplifier (e.g., S/A 0) senses and amplifies the voltage difference between the received bit cell signal and the reference signal and outputs the amplified voltage difference. A signal waveform of the sense amplifier S/A 0 is shown in section B of FIG. 6.

As described above, the semiconductor memory device depicted in FIG. 3 has a reference cell array unit 320 that includes a plurality of reference cells. The semiconductor memory device stores the reference cell voltage (VDD/VSS) in each of the reference cells in response to activation of the ready signal VRPRE, and outputs the reference signal read from corresponding reference cell (e.g., the reference cell 321) to the selected complementary bit line (e.g., the VBLB0 signal line) and the adjacent complementary bit line (e.g., the VBLB1 signal line) in response to activation of the reference word line signal. The semiconductor memory device depicted in FIG. 5 likewise has a reference cell array unit 520 that includes a plurality of reference cells. This semiconductor memory device provides the first supply voltage VSS to a first capacitor (e.g., capacitor CR51) and the second supply voltage VDD to a second capacitor (e.g., capacitor CR52) in response to the activation of the ready signal VRPRE, stores the reference cell voltage resulting from charge sharing between the two capacitors in the reference cell in response to activation of the short signal VSHT, and outputs the reference signals read from the two capacitors included in the reference cell (e.g., reference cell 521) that corresponds to the selected complementary bit line (e.g., the VBLB0 signal line) and the adjacent complementary bit line (e.g., the VBLB1 signal line) in response to activation of the reference word line signal.

With both the reference cell array unit 320 and the reference cell array unit 520, the voltage difference between the voltage delivered to the selected complementary bit line and the voltage delivered to the selected bit line can be applied to the precharging of the first supply voltage VSS and the precharging of the second supply voltage VDD. It can also be applied to a semiconductor memory device using a dual port that improves its operating speed by enabling a data read operation and a data write operation to occur simultaneously.

The semiconductor memory devices according to embodiments of the present invention output bit cell data by sensing and amplifying a small voltage difference between a bit line, that undergoes a small voltage change by sharing charge with a capacitor of a bit cell in a bit cell data read operation, and a complementary bit line that is charged to a reference voltage. In embodiments of the present invention, this may be accomplished without the use of a separate reference voltage generator. Accordingly, the semiconductor memory device stably outputs bit cell data in both cases where the bit cell data is "1" and "0", and the size of the chip and the power the device consumes in operation may be reduced since a half VDD generator is not required.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A semiconductor memory device, comprising:
  a memory cell array having at least first and second memory cells and at least one word line, the first memory cell having an associated first bit line and an associated first complementary bit line and the second memory cell having an associated second bit line and an associated second complementary bit line;
  a reference cell array having an associated reference word line and a reference cell, wherein the reference cell includes a first capacitor that is coupled to a first supply voltage, a first transistor having a control terminal that is coupled to the reference word line and a second transistor having a control terminal that is coupled to the reference word line, wherein the first capacitor is coupled to the first complementary bit line through the first transistor and that is coupled to the second complimentary bit line through the second transistor; and
  at least one sense amplifier that is associated with the first memory cell and that is configured to sense and amplify the voltage difference between a signal on the first bit line and a signal on the first complementary bit line.

2. The semiconductor memory device of claim 1, wherein the signal on the first bit line comprises a data signal output from the first memory cell and wherein the signal on the first complementary bit line comprises a signal output from the reference cell.

3. The semiconductor device of claim 2, wherein the reference cell supplies a reference cell voltage to both the first and second memory cells.

4. The semiconductor memory device of claim 1, wherein a reference cell voltage signal is output from the first capacitor to the first complementary bit line in response to the activation of a reference word line signal that turns on the first and second transistors.

5. The semiconductor memory device of claim 4, wherein a pulse width of an activated word line signal that is carried by the word line associated with the first memory cell is greater than a pulse width of the activated reference word line signal.

6. The semiconductor memory device of claim 1, wherein the first bit line and the first complementary bit line are precharged to a second supply voltage that is different than the first supply voltage.

7. The semiconductor memory device of claim 4, wherein the reference cell further comprises a third transistor coupled between the first supply voltage and the first capacitor, wherein the third transistor is turned on in response to activation of a ready signal to charge the first capacitor to the first supply voltage.

8. The semiconductor memory device of claim 1, wherein the reference cell further comprises a third transistor and a second capacitor, wherein the second capacitor is coupled to the first complementary bit line through the third transistor and the first transistor and is coupled to the second complimentary bit line through the second transistor, and wherein the second capacitor is coupled to a second supply voltage.

9. The semiconductor memory device of claim 8, wherein a reference cell voltage is stored in the first and second capacitors in response to a signal that turns on the third transistor to cause charge-sharing between the first and second capacitors.

10. The semiconductor memory device of claim 9, wherein the reference cell further comprises a fourth transistor coupled between the first capacitor and the first supply voltage and a fifth transistor coupled between the second capacitor and the second supply voltage.

11. A method of reading a data bit from a memory cell in a memory cell array, the memory cell array further comprising a bit line, a complementary bit line and a word line that are associated with the memory cell, the method comprising:
  precharging the bit line and the complementary bit line to a first supply voltage;
  storing a second supply voltage in a reference cell that is associated with the memory cell;
  outputting a reference signal having a voltage between the first supply voltage and the second supply voltage from the reference cell to the complementary bit line through a first transistor that is activated by activation of a reference word line signal and outputting the reference signal from the reference cell to a second complimentary bit line through a second transistor that is activated by activation of the reference word line signal; and
  sensing and amplifying the voltage difference between the bit line and the complementary bit line to output the data bit from the memory cell.

12. The method of claim 11, wherein the reference signal has a voltage equal to approximately one-half the second supply voltage.

13. The method of claim 11, further comprising storing the reference signal having a voltage between the first supply voltage and the second supply voltage in a first capacitor prior to outputting the reference signal to the complimentary bit line and to the second complimentary bit line.

14. The method of claim 11, wherein storing the second supply voltage in the reference cell that is associated with the memory cell comprises storing the second supply voltage in a first capacitor of the reference cell in response to activation of a ready signal.

15. The method of claim 11, wherein the second supply voltage is stored in a first capacitor in the reference cell and further comprising storing the first supply voltage in a second capacitor included in the reference cell.

16. The method of claim 15, further comprising storing a reference cell voltage in at least one of the first and second capacitors by sharing charge between the first and second capacitors.

17. The method of claim 16, wherein the reference cell voltage stored in the at least one of the first and second capacitors is in between the first supply voltage and the second supply voltage.

18. The method of claim 14, further comprising outputting a second reference signal from the reference cell that is in between the first supply voltage and a second supply voltage to a complimentary bit line associated with a second memory cell.

19. A semiconductor memory device which outputs bit cell data in a read operation, comprising:
   a bit cell array which stores the bit cell data in a plurality of bit cells, each bit cell defined by intersection of a plurality of bit lines, a plurality of complementary bit lines and a plurality of word lines, the bit cell array outputting a bit cell signal, read from a bit cell in the plurality of bit cells that is defined by an activated word line signal, a selected bit line and a selected complementary bit line, to the selected first bit line;
   a reference cell array having a plurality of reference cells that each store a reference cell voltage, wherein the reference cell associated with the bit cell defined by the activated word line signal, the selected bit line and the selected complementary bit line includes a first capacitor that is coupled to a first supply voltage, to the selected complementary bit line through a first transistor having a control terminal that is coupled to a reference word line signal and to a second complementary bit line through a second transistor having a control terminal that is coupled to the reference word line signal; and
   a sense amplifying unit, which senses the bit cell signal output to the selected bit line and a reference signal output to the selected complementary bit line from the reference cell associated with the bit cell defined by the activated word line signal, the selected bit line and the selected complementary bit line amplifies a voltage difference between the bit cell signal and the reference signal, and outputs the amplified voltage difference.

20. The semiconductor memory device of claim 19, wherein the reference signal provided to the complimentary bit line and to the second complimentary bit line is the charge stored in the first capacitor shared between the complimentary bit line and the second complimentary bit line.

21. The semiconductor memory device of claim 19, wherein a pulse width of the activated reference word line signal is smaller than a pulse width of the activated word line signal.

22. The semiconductor memory device of claim 19, wherein the reference cell associated with the bit cell defined by the activated word line signal, the selected bit line and the selected complementary bit line further comprises a third transistor and a second capacitor, wherein the second capacitor is coupled to the first complementary bit line through the third transistor and the first transistor and is coupled to the second complimentary bit line through the second transistor, and wherein the second capacitor is coupled to a second supply voltage.

23. A method of reading bit cell data from a semiconductor memory device, the method comprising:
   storing the bit cell data in a bit cell having an associated bit line, an associated complementary bit line and an associated word line;
   storing a first supply voltage in a first capacitor of a reference cell associated with the bit cell in response to activation of a ready signal;
   storing a second supply voltage in a second capacitor of the reference cell associated with the bit cell in response to activation of the ready signal;
   activating a first transistor coupled between the first capacitor and the second capacitor to store a reference cell voltage having a value between the first supply voltage and the second supply voltage in each of the first and second capacitors;
   outputting a bit cell signal which is read from the bit cell to the bit line;
   outputting a reference signal from the reference cell to the complementary bit line and to a second complementary bit line associated with a second bit cell;
   sensing the bit cell signal output to the bit line and the reference signal output to the complementary bit line;
   amplifying a voltage difference between the bit cell signal and the reference signal; and
   outputting the amplified voltage difference.

24. The method of claim 23, wherein the bit line and the complementary bit line are precharged to a first supply voltage prior to the read operation.

* * * * *